United States Patent
Lei

(10) Patent No.: US 12,003,234 B2
(45) Date of Patent: Jun. 4, 2024

(54) BOOTSTRAPPED SWITCH

(71) Applicant: REALTEK SEMICONDUCTOR CORPORATION, Hsinchu (TW)

(72) Inventor: Liang-Huan Lei, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 18/098,132

(22) Filed: Jan. 18, 2023

(65) Prior Publication Data
US 2023/0268920 A1    Aug. 24, 2023

(30) Foreign Application Priority Data

Feb. 22, 2022    (TW) ................................. 111106388

(51) Int. Cl.
*H03K 17/687*    (2006.01)
(52) U.S. Cl.
CPC ............................. *H03K 17/6872* (2013.01)
(58) Field of Classification Search
CPC .............................................. H03K 17/6872
See application file for complete search history.

(56) References Cited

U.S. PATENT DOCUMENTS 5,084,634 A     1/1992  Gorecki
9,379,702 B2 *  6/2016  Yang .................... H03K 17/161
11,070,207 B2 * 7/2021  Huang ............. H03K 19/01735
2012/0313800 A1* 12/2012 Thomas ................ G11C 27/024
                                                    341/122
2021/0105014 A1   4/2021  Huang

FOREIGN PATENT DOCUMENTS

TW           202116019 A        4/2021

OTHER PUBLICATIONS 97.477 Lecture, "MOSFET Capacitances", Jan. 13, 2003, 97.477 Lecture.
OA letter of a counterpart TW application (appl. no. 111106388) mailed on Jul. 25, 2022.

* cited by examiner

*Primary Examiner* — Ryan Johnson
*Assistant Examiner* — Colleen J O Toole
(74) *Attorney, Agent, or Firm* — WPAT, PC

(57) ABSTRACT

A bootstrapped switch includes a sampling transistor, a bootstrapped circuit, and a buffer circuit. The sampling transistor is configured to be selectively turned on according to a level of a control node, in order to transmit an input signal from a first terminal of the sampling transistor to a second terminal of the sampling transistor, in which a body of the sampling transistor is configured to receive a buffer signal. The bootstrapped circuit is configured to pull up the level of the control node, such that a constant voltage difference is present between the control node and the first terminal of the sampling transistor during a turn-on interval of the sampling transistor. The buffer circuit is configured to generate the buffer signal according to the input signal.

12 Claims, 3 Drawing Sheets

BOOTSTRAPPED SWITCH

BACKGROUND OF THE INVENTION

1. Field of the Invention

The present disclosure relates to a bootstrapped switch. More particularly, the present disclosure relates to a bootstrapped switch able to reduce impacts from a voltage dependent capacitor.

2. Description of Related Art

A switch circuit is commonly applied to an analog to digital converter and/or a digital to analog converter. In order to achieve a signal conversion having high linearity, a switch circuit having high performance is needed. For example, a bootstrapped switch is proposed to provide a stable turn-on resistance to have higher linearity. However, in an existing bootstrapped switch, a transistor is still suffered from impacts of a voltage dependent parasitic capacitor, and thus the existing bootstrapped switch cannot meet the linearity requirement of the current application.

SUMMARY OF THE INVENTION

In some aspects, one object of the present disclosure is, but not limited to, to provide a bootstrapped switch able to reduce impacts from a voltage dependent capacitor.

In some aspects, a bootstrapped switch includes a sampling transistor, a bootstrapped circuit, and a buffer circuit. The sampling transistor is configured to be selectively turned on according to a level of a control node, in order to transmit an input signal from a first terminal of the sampling transistor to a second terminal of the sampling transistor, in which a body of the sampling transistor is configured to receive a buffer signal. The bootstrapped circuit is configured to pull up the level of the control node, such that a constant voltage difference is present between the control node and the first terminal of the sampling transistor during a turn-on interval of the sampling transistor. The buffer circuit is configured to generate the buffer signal according to the input signal.

In some aspects, a bootstrapped switch may utilize a body biasing to reduce impacts from a voltage dependent capacitor and to improve the linearity of the bootstrapped switch.

In some aspects, a bootstrapped switch includes a sampling transistor, a bootstrapped circuit, and a buffer circuit. The sampling transistor is configured to be selectively turned on according to a level of a control node, in order to transmit an input signal from a first terminal of the sampling transistor to a second terminal of the sampling transistor. The bootstrapped circuit is configured to pull up the level of the control node, such that a constant voltage difference is present between the control node and the first terminal of the sampling transistor during a turn-on interval of the sampling transistor, in which a body of at least one first transistor in a plurality of N-type transistors of the bootstrapped circuit is configured to receive a buffer signal. The buffer circuit is configured to generate the buffer signal according to the input signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
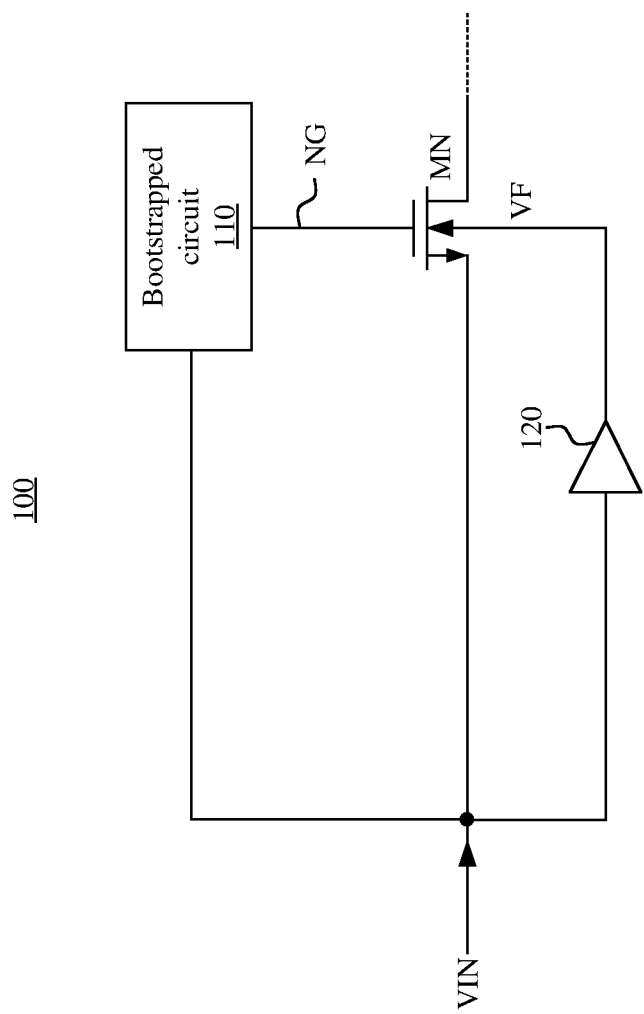
FIG. 1 illustrates a schematic diagram of a bootstrapped switch according to some embodiments of the present disclosure.

FIG. 1 illustrates a schematic diagram of a bootstrapped switch 100 according to some embodiments of the present disclosure. In some embodiments, the bootstrapped switch 100 may be applied in a sampling (or sample and hold) circuit, in order to sample an input signal VIN. For example, a second terminal of the sampling transistor MN (e.g., drain) may be coupled to a capacitor in a sampling circuit (not shown), in order to store the sampled input signal VIN.

The bootstrapped switch 100 includes a sampling transistor MN, a bootstrapped circuit 110, and a buffer circuit 120. A first terminal of the sampling transistor MN (e.g., source) receives the input signal VIN, a control terminal of the sampling transistor MN (e.g., gate) is coupled to a control node NG, and a fourth terminal of the sampling transistor MN (e.g., bulk or body) receives a buffer signal VF. The sampling transistor MN may be selectively turned on according to a level of the control node NG, in order to transmit the input signal VIN from the first terminal of the sampling transistor MN to the second terminal of the sampling transistor MN.

The bootstrapped circuit 110 is configured to pull up a level of the control node NG, such that a constant voltage difference is present between the control node NG and the first terminal of the sampling transistor MN during a turn-on interval of the sampling transistor MN (i.e., during the sampling transistor MN is turned on). As a result, the sampling transistor MN is able to have a stable turn-on resistance, in order to have a better linearity. In general, a turn-on resistance of a transistor is determined by its gate-source voltage (i.e., voltage difference between gate and source) As the source of the transistor may receive a time-variant signal (e.g., the input signal VIN), the turn-on resistance of the transistor is dependent on the input signal VIN, which results in a nonlinear distortion. With the bootstrapped circuit 110, it is able to set a constant voltage difference present between the control node NG and the first terminal of the sampling transistor MN (i.e., between the gate and the source of the sampling transistor MN) during the turn-on interval of the sampling transistor MN. As a result, the turn-on resistance of the sampling transistor MN can be more stable, in order to reduce the impacts from the nonlinear distortion.

The buffer circuit 120 is configured to generate the buffer signal VF according to the input signal VIN. In some embodiments, the buffer circuit 120 may be a voltage follower or a unity gain buffer implemented with an amplifier, but the present disclosure is not limited thereto. As mentioned above, the body of the sampling transistor MN is configured to receive the buffer signal VF instead of directly receiving the input signal VIN. In general, the source and the body of the same transistor may be directly connected together, such that the voltage difference between the source and the body is zero to reduce the impacts of the body effect. Taking the sampling transistor MN as an example, in a general configuration, the body of the sampling transistor MN is configured to be connected to the source of the sampling transistor MN and receive the input signal VIN. However, in practical applications, the input signal VIN is required to provide to other nodes in the system or to drive other circuits. Equivalently speaking, those nodes and/or circuits are coupled to each other. Non-ideal effects of those nodes and/or circuit (e.g., parasitic capacitance, signal disturbance, and so on) may affect other circuits, which results in a degradation of the circuit performance. For example, in a semiconductor structure, the sampling transistor MN may have a voltage dependent parasitic capacitor (which may be, but not limited to, a parasitic capacitor between a N-well and a P-substrate). The capacitance value of this parasitic capacitor may be varied in response to the disturbance of the voltage (or current) from other nodes or circuits. As a result, a non-linear distortion is thus present in the sampling transistor MN.

Compared with the above configuration, in this embodiment, the body of the sampling transistor MN is configured to receive the buffer signal VF, in which the buffer signal VF is generated by the buffer circuit 120 based on the input signal VIN, and a level of the buffer signal VF may be equal to that of the input signal VIN. With such configuration, the number of circuits and/or nodes driven by the input signal VIN can be reduced, and the buffer signal VF generated from the buffer circuit 120 has a certain driving ability, and thus is able to be utilized to drive certain nodes (e.g., the body of the sampling transistor MN and/or bodies of other transistors as discussed below). As a result, by configuring the body of the sampling transistor MN to receive the buffer signal VF (instead of receiving the input signal VIN directly), it is able to reduce the variation of the capacitance value of the parasitic capacitor (which is voltage dependent) in the sampling transistor MN, in order to increase the linearity of the bootstrapped switch 100. In addition, as the level of the buffer signal VF is the same as that of the input signal VIN, the impacts of the body effect on the sampling transistor MN can be reduced as well.

In some embodiments, during the turn-on interval of the sampling transistor MN, the body of at least one N-type transistor in the bootstrapped circuit 110 (which is turned on during the turn-on interval of the sampling transistor MN and receives the input signal VIN) may receive the buffer signal VF (instead of directly receiving the input signal VIN). As a result, it is able to further reduce the number of circuit(s) and/or node(s) driven by the input signal VIN, in order to further improve the performance of the bootstrapped switch 100.

Figure 2:
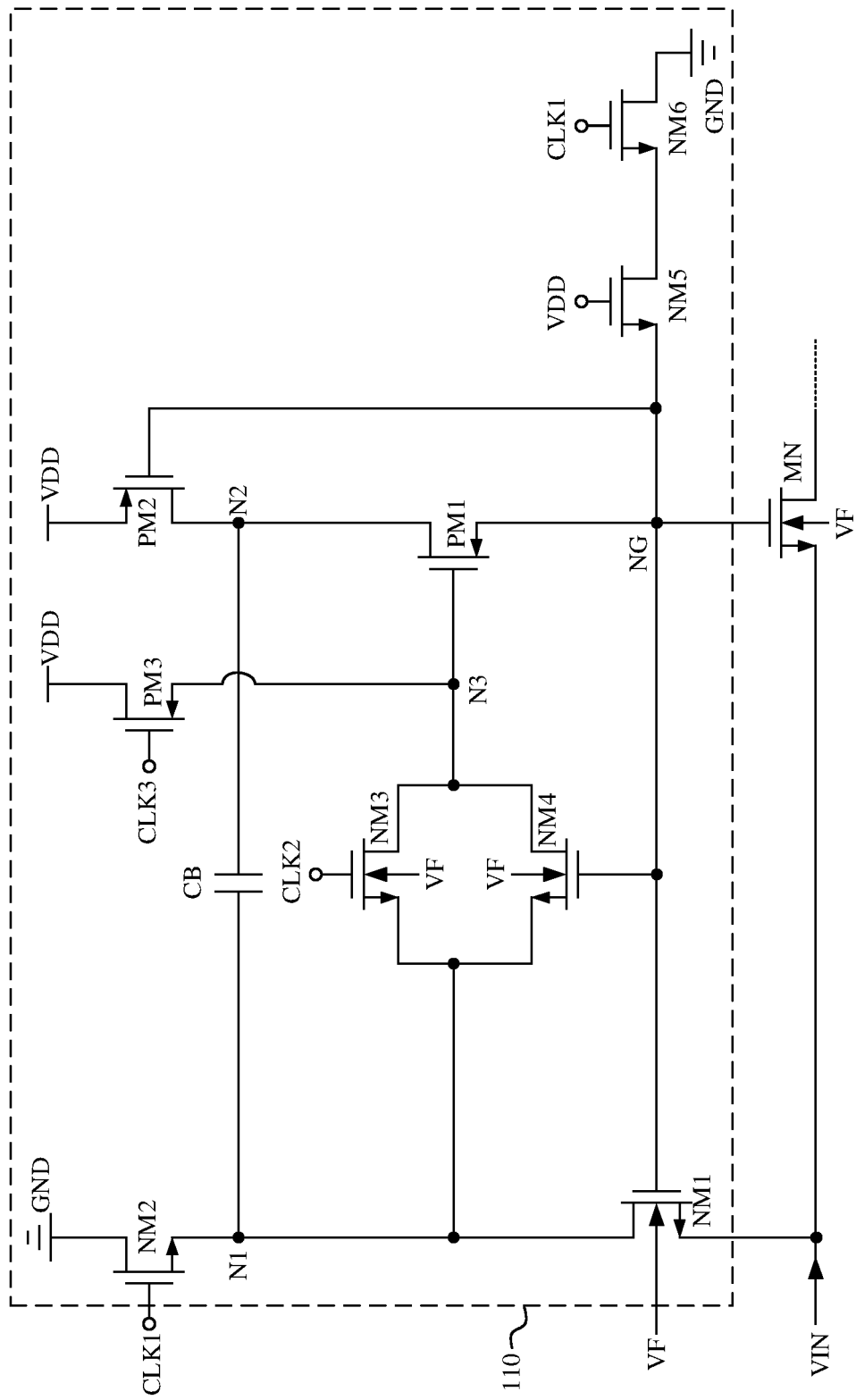
FIG. 2 illustrates a circuit diagram of the bootstrapped circuit and the sampling transistor in FIG. 1 according to some embodiments of the present disclosure.

FIG. 2 illustrates a circuit diagram of the bootstrapped circuit 110 and the sampling transistor MN in FIG. 1 according to some embodiments of the present disclosure. In this example, the bootstrapped circuit 110 includes N-type transistors NM1-NM6, P-type transistors PM1-PM3, and a capacitor CB.

A first terminal and a second terminal of the capacitor CB are coupled to the node N1 and the node N2, respectively. A first terminal of the N-type transistor NM1 (e.g., drain) is coupled to the node N1, a second terminal of the N-type transistor NM1 (e.g., source) is coupled to the first terminal of the sampling transistor MN and receives the input signal VIN, and a control terminal of the N-type transistor NM1 (e.g., gate) is coupled to the control node NG. The N-type transistor NM1 may be selectively turned on according to the level of the control node NG, in order to couple the first terminal of the sampling transistor MN to the node N1. A first terminal of the N-type transistor NM2 is coupled to ground GND, a second terminal of the N-type transistor NM2 is coupled to the node N1, and a control terminal of the N-type transistor NM2 receives a clock signal CLK1. The N-type transistor NM2 may be selectively turned on according to the clock signal CLK1, in order to couple the node N1 to ground GND. A first terminal of the N-type transistor NM3 (e.g., source) and the first terminal of the N-type transistor NM4 (e.g., source) are coupled to the node N1, the second terminal of the N-type transistor NM3 (e.g., drain) and the second terminal of the N-type transistor NM4 (e.g., drain) are coupled to a node N3, a control terminal of the N-type transistor NM3 receives a clock signal CLK2, and a control terminal of the N-type transistor NM4 is coupled to the control node NG. The N-type transistor NM3 may be selectively turned on according to the clock signal CLK2, in order to couple the node N1 to the node N3. The N-type transistor NM4 may be selectively turned on according to the level of the control node NG, in order to couple the node N1 to the node N3.

A first terminal of the N-type transistor NM5 (e.g., source) is coupled to the control node NG, a second terminal of the N-type transistor NM5 (e.g., drain) is coupled to a first terminal of the N-type transistor NM6 (e.g., source), and a control terminal of the N-type transistor NM5 receives a supply voltage VDD. A second terminal of the N-type transistor NM6 is coupled to ground GND, and a control terminal of the N-type transistor NM6 receives the clock signal CLK1. The N-type transistor NM5 is turned on according to the supply voltage VDD, and the N-type transistor NM6 may be selectively turned on according to the clock signal CLK1, in order to couple the control node NG to ground GND via the N-type transistor NM5.

A first terminal of the P-type transistor PM1 (e.g., drain) is coupled to the node N2, a second terminal of the P-type transistor PM1 (e.g., source) is coupled to the control node NG, and a control terminal of the P-type transistor PM1 is coupled to the node N3. The P-type transistor PM1 may be selectively turned on according to the level of the node N3, in order to couple the node N2 to the control node NG. A first terminal of the P-type transistor PM2 (e.g., source) receives the supply voltage VDD, a second terminal of the P-type transistor PM2 (e.g., drain) is coupled to the node N2, and a control terminal of the P-type transistor PM2 is coupled to the control node NG. The P-type transistor PM2 may be selectively turned on according to the level of the control node NG, in order to transmit the supply voltage VDD to the node N2. A first terminal of the P-type transistor PM3 (e.g., drain) receives the supply voltage VDD, a second terminal of the P-type transistor PM3 (e.g., source) is coupled to the node N3, and a control terminal of the P-type transistor PM3 receives a clock signal CLK3. The P-type transistor PM3 may be selectively turned on according to the clock signal CLK3, in order to transmit the supply voltage VDD to the node N3.

Operations of the bootstrapped circuit 110 are described as follows. In some embodiments, the clock signal CLK1, the clock signal CLK2, and the clock signal CLK3 may be non-overlapping clock signals. During an enabling interval the clock signal CLK1, the N-type transistors NM2 and NM6 are turned on. The control node NG may be coupled to ground GND via the N-type transistors NM5 and NM6, in order to turn on the P-type transistor PM2. Under this condition, the node N1 is coupled to ground GND via the N-type transistor NM5, and the node N2 receives the supply voltage VDD via the P-type transistor PM2. As a result, the capacitor CB may be charged by the supply voltage VDD, such that a voltage drop across two terminals of the capacitor CB is the supply voltage VDD. During an enabling interval of the clock signal CLK2 (which equals to the turn-on interval of the sampling transistor MN), the N-type transistor NM3 is turned on to couple the node N1 to the node N3. Under this condition, the voltage difference between the node N2 and the node N3 is about equal to the supply voltage VDD, and thus the P-type transistor PM1 is turned on. Under this condition, the level of the control node NG is shifted up by the supply voltage VDD, which turns off the P-type transistor PM2 and turns on the N-type transistor NM1 and the sampling transistor MN. The N-type transistor NM1 may transmit the input signal VIN to the node N1, such that the level of the control node NG is equal to the sum of the supply voltage VDD and the input signal VIN. When the level of the input signal VIN is pulled up to the supply voltage VDD, the N-type transistor NM3 is turned off but the N-type transistor NM4 is turned on to continuously couple the node N1 to the node N3. As a result, it can assure that the voltage difference between the first terminal and the control terminal of the sampling transistor MN may be a constant voltage difference (i.e., the supply voltage VDD) during the turn-on interval of the sampling transistor MN, in order to have a stable turn-on resistance. During an enabling interval of the clock signal CLK3, the P-type transistor PM3 is turned on to pull up the level of the node N3 to the supply voltage VDD. Under this condition, the P-type transistor PM2 is turned off, and thus the sampling transistor MN is turned off. After the level of the node N3 is pulled to the supply voltage VDD, the enabling interval of the clock signal CLK1 starts.

As mentioned above, during the turn-on interval of the sampling transistor MN, the N-type transistor NM1, the N-type transistor NM3, and the N-type transistor NM4 are turned on and receive the input signal VIN. In embodiments of FIG. 2, the bodies of the N-type transistor NM1, the N-type transistor NM3, and the N-type transistor NM4 may be configured to receive the buffer signal VF, in order to further improve the performance of the bootstrapped switch 100.

Figure 3:
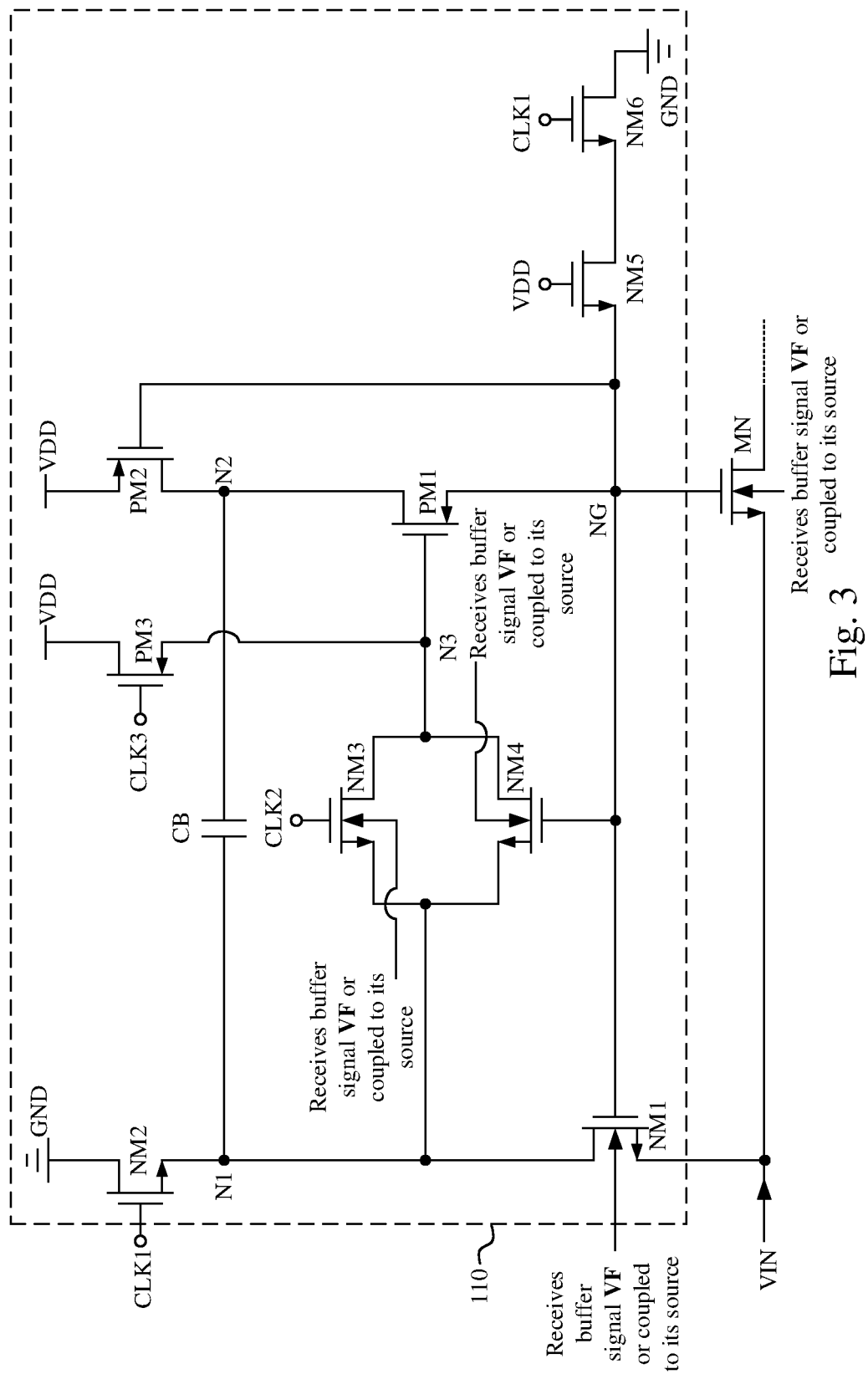
FIG. 3 illustrates a circuit diagram of the bootstrapped circuit and the sampling transistor in FIG. 1 according to some embodiment of the present disclosure.

FIG. 3 illustrates a circuit diagram of the bootstrapped circuit 110 and the sampling transistor MN in FIG. 1 according to some embodiment of the present disclosure. Different from FIG. 2, in this example, the body of at least one of N-type transistors that are turned on and receive the input signal VIN during the turn-on interval of the sampling transistor MN (e.g., the sampling transistor MN, the N-type transistor NM1, the N-type transistor NM3, and the N-type transistor NM4) may be configured to receive the buffer signal VF or coupled to the source of the same transistor.

For example, the body of the sampling transistor MN may receive the buffer signal VF or may be coupled to the source of the sampling transistor MN. Alternatively, the body of the N-type transistor NM1 may receive the buffer signal VF or may be coupled to the source of the N-type transistor NM1. With this analogy, it should be understood that the configurations in FIG. 3. In other words, in different embodiments, during the turn-on interval of the sampling transistor MN, a body of at least one N-type transistor in the bootstrapped switch 100, which is turned on and receives the input signal VIN, may be configured to receive the buffer signal VF, in order to reduce impacts of the voltage dependent parasitic capacitor and improve the linearity. In some embodiments, the number of N-type transistors that receive the buffer signal VF is more, the performance of the bootstrapped switch 100 is higher.

It is noted that the configurations of the bootstrapped circuit 110 in FIGS. 2 and 3 are given for illustrative purposes, and the present disclosure is not limited thereto. Various types of the bootstrapped circuit 110 able to generate a constant voltage difference are within the contemplated scope of the present disclosure.

In the above embodiments, each transistor may be implemented with a metal-oxide semiconductor field transistor (MOSFET), but the present disclosure is not limited thereto. According to practical requirements, various types of transistors may be utilized to implement the bootstrapped switch 100.

As described above, the bootstrapped switch provided in some embodiments of the present disclosure may utilize the body biasing to reduce impacts of the voltage dependent parasitic capacitor, in order to improve the linearity of the bootstrapped switch.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry.

Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A bootstrapped switch, comprising:
   a sampling transistor configured to be selectively turned on according to a level of a control node, in order to transmit an input signal from a first terminal of the sampling transistor to a second terminal of the sampling transistor, wherein a body of the sampling transistor is configured to receive a buffer signal;
   a bootstrapped circuit configured to pull up the level of the control node, such that a constant voltage difference is present between the control node and the first terminal of the sampling transistor during a turn-on interval of the sampling transistor; and
   a buffer circuit configured to generate the buffer signal according to the input signal,
   wherein the bootstrapped circuit comprises a plurality of N-type transistors, a body of at least one of the plurality of N-type transistors is configured to receive the buffer signal, and the at least one of the plurality of N-type transistors is turned on and receives the input signal during the turn-on interval of the sampling transistor.

2. The bootstrapped switch of claim 1, wherein a body of at least one transistor in the plurality of N-type transistors does not receive the buffer signal and is coupled to a source of the at least one transistor.

3. The bootstrapped switch of claim 1, wherein the body of the at least one of the plurality of N-type transistors does not directly receive the input signal.

4. The bootstrapped switch of claim 3, wherein the at least one of the plurality of N-type transistors is turned on and receives the input signal during the turn-on interval of the sampling transistor.

5. The bootstrapped switch of claim 1, wherein the bootstrapped circuit further comprises:
   a capacitor, wherein two terminals of the capacitor are coupled to a first node and a second node, respectively;
   a first P-type transistor configured to be selectively turned on according to a level of a third node, in order to couple the second node to the control node;
   a second P-type transistor configured to be selectively turned on according to the level of the control node, in order to transmit a supply voltage to the second node; and
   a third P-type transistor configured to be selectively turned on according to a third clock signal, in order to transmit the supply voltage to the third node, and
   wherein the plurality of N-type transistors comprise:
   a first N-type transistor configured to be selectively turned on according to the level of the control node, in order to couple the first terminal of the sampling transistor to the first node;
   a second N-type transistor configured to be selectively turned on according to a first clock signal, in order to couple the first node to ground;
   a third N-type transistor configured to be selectively turned on according to a second clock signal, in order to couple the first node to the third node; and
   a fourth N-type transistor configured to be selectively turned on according to the level of the control node, in order to couple the first node to the third node.

6. The bootstrapped switch of claim 5, wherein the second N-type transistor is not turned on during the turn-on interval of the sampling transistor.

7. The bootstrapped switch of claim 5, further comprising:
   a fifth N-type transistor configured to be turned on according to the supply voltage; and
   a sixth N-type transistor configured to be selectively turned on according to the first clock signal, in order to couple the control node to ground via the fifth N-type transistor.

8. The bootstrapped switch of claim 1, wherein the body of the sampling transistor receives the buffer signal to reduce a variation of a capacitance value of a parasitic capacitor of the sampling transistor, and the parasitic capacitor is voltage dependent.

9. A bootstrapped switch, comprising:
   a sampling transistor configured to be selectively turned on according to a level of a control node, in order to transmit an input signal from a first terminal of the sampling transistor to a second terminal of the sampling transistor;
   a bootstrapped circuit configured to pull up the level of the control node, such that a constant voltage difference is present between the control node and the first terminal of the sampling transistor during a turn-on interval of the sampling transistor, wherein a body of at least one transistor in a plurality of N-type transistors of the bootstrapped circuit is configured to receive a buffer signal, and the plurality of N-type transistors are turned on and receive the input signal during the turn-on interval of the sampling transistor; and
   a buffer circuit configured to generate the buffer signal according to the input signal.

10. The bootstrapped switch of claim 9, wherein a body of a first transistor in the plurality of N-type transistors does not receive the buffer signal and is coupled to a source of the first transistor.

11. The bootstrapped switch of claim 9, wherein a body of the sampling transistor is coupled to a source of the sampling transistor.

12. A bootstrapped switch, comprising:
   a sampling transistor configured to be selectively turned on according to a level of a control node, in order to transmit an input signal from a first terminal of the sampling transistor to a second terminal of the sampling transistor, wherein a body of the sampling transistor is configured to receive a buffer signal;
   a bootstrapped circuit configured to pull up the level of the control node, such that a constant voltage difference is present between the control node and the first terminal of the sampling transistor during a turn-on interval of the sampling transistor; and
   a buffer circuit configured to generate the buffer signal according to the input signal,
   wherein the bootstrapped circuit comprises a plurality of N-type transistors, a body of at least one first transistor of the plurality of N-type transistors is configured to receive the buffer signal, and a body of at least one second transistor in the plurality of N-type transistors does not receive the buffer signal and is coupled to a source of the at least one second transistor.

* * * * *